United States Patent [19]
Barth et al.

[11] Patent Number: 6,134,172
[45] Date of Patent: *Oct. 17, 2000

[54] APPARATUS FOR SHARING SENSE AMPLIFIERS BETWEEN MEMORY BANKS

[75] Inventors: Richard M. Barth; Donald C. Stark, both of Palo Alto; Ely K. Tsern, Los Altos, all of Calif.

[73] Assignee: Rambus Inc., Mountain View, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/862,641

[22] Filed: May 23, 1997

Related U.S. Application Data

[60] Provisional application No. 60/033,889, Dec. 26, 1996.

[51] Int. Cl.[7] .................................................... G11C 8/00
[52] U.S. Cl. ...................... 365/230.03; 365/205; 365/207
[58] Field of Search ................................ 365/230.03, 205, 365/207

[56] References Cited

U.S. PATENT DOCUMENTS

| | | | |
|---|---|---|---|
| 3,845,476 | 10/1974 | Boehm | 340/173 BB |
| 4,303,986 | 12/1981 | Lans | 364/900 |
| 4,845,677 | 7/1989 | Chappell et al. | 365/189.02 |
| 4,933,907 | 6/1990 | Kumanoya et al. | 365/230.03 |
| 4,947,373 | 8/1990 | Yamaguchi et al. | 365/230.03 |
| 5,040,152 | 8/1991 | Voss et al. | |
| 5,043,947 | 8/1991 | Ushima et al. | 365/230.03 |
| 5,102,459 | 4/1992 | Chu et al. | 365/63 |
| 5,267,214 | 11/1993 | Fujishima et al. | 365/230.03 |
| 5,270,975 | 12/1993 | McAdams | 365/200 |
| 5,444,305 | 8/1995 | Matsui | 365/230.03 |
| 5,452,260 | 9/1995 | Matsui et al. | 365/230.03 |
| 5,487,050 | 1/1996 | Kim et al. | 365/230.03 |
| 5,499,216 | 3/1996 | Yamamoto | 365/230.03 |
| 5,544,113 | 8/1996 | Kirihata et al. | 365/200 |
| 5,586,078 | 12/1996 | Takase et al. | 365/230.03 |
| 5,623,452 | 4/1997 | Lee | 365/230.03 |
| 5,657,285 | 8/1997 | Rao | 365/230.03 |
| 5,706,244 | 1/1998 | Shimizu | 365/230.03 |
| 5,812,418 | 9/1998 | Lattimore et al. | 364/491 |

FOREIGN PATENT DOCUMENTS

0704847 A1  4/1996  European Pat. Off. .

OTHER PUBLICATIONS

International Search Report, PCT/US97/23106, 6 pages.
Written Opinion, PCT/US97/23106, 3 pages.
Przybylski, Steven, Mo Sys Reveals MDRAM Architecture, Microprocessor Report, pp. 17–20, Dec. 25, 1995.

Primary Examiner—Tan T. Nguyen
Attorney, Agent, or Firm—Blakely, Sokoloff, Taylor & Zafman LLP

[57] ABSTRACT

A memory device includes a first memory bank and a second memory bank, each memory bank having at least one subarray of memory cells. Multiple sense amplifiers are coupled to at least one subarray of memory cells. At least one sense amplifier is configured for use by both the first memory bank and the second memory bank, but not simultaneously. The sharing of sense amplifiers between memory banks minimizes the die area penalty caused by additional memory banks. The memory device is configured such that the first memory bank is adjacent to the second memory bank.

19 Claims, 4 Drawing Sheets

FIG_2

FIG_3

APPARATUS FOR SHARING SENSE AMPLIFIERS BETWEEN MEMORY BANKS

This application claims the benefit of U.S. provisional application Ser. No. 60/033,889 filed on Dec. 26, 1996.

FIELD OF THE INVENTION

The present invention relates to data storage devices. More specifically, the invention provides a system that allows multiple memory banks to share one or more sense amplifiers.

BACKGROUND OF THE INVENTION

A memory device may include one or more memory banks. A memory bank typically includes multiple memory subarrays and multiple sense amplifiers. Additionally, a memory bank includes row decoders and column decoders to decode row and column addresses to access the data stored within the memory subarrays.

To improve memory performance or reduce power, memory devices have been developed that include multiple memory banks in a single device. The use of multiple memory banks in a single memory device increases performance by permitting simultaneous access to two or more different memory banks. An increased number of memory banks means fewer sense amplifiers per bank. This reduction in the number of sense amplifiers in each bank causes fewer sense amplifiers to be activated and fewer bit lines to be charged during a memory access, thereby reducing the power of the device. In existing memory devices, each memory bank is independent; i.e., each memory bank is capable of being operated and accessed separately from the other memory banks.

In any given memory core, the arrangement and orientation of the memory subarrays allows for a wide variety of memory bank organizations. Typically, additional memory banks cost die area. This die area penalty is caused by the additional row decoders and control circuits required to support each memory bank, and by the additional sense amplifier arrays for the memory subarrays to provide fully independent memory bank operation.

Memory core organizations can be classified into two broad categories: conventional organizations in which I/O wires are perpendicular to the bit lines, and hierarchical organizations in which the I/O wires are parallel to the bit lines.

FIG. 1 illustrates a die for a memory device having a conventional core architecture. Die 10 includes four independent memory banks 12, 14, 16, and 18 arranged as shown. Each memory bank 12–18 includes multiple arrays of sense amplifiers 20 shared between multiple memory subarrays 22. Memory subarrays 22 are arranged such that an array of sense amplifiers 20 is located on opposite sides of each memory subarray 22. Sense amplifiers 20 are used to determine the data stored in an adjacent memory subarray 22. Note that no sense amplifiers are shared between memory banks, although sense amplifiers are shared between memory subarrays within a particular memory bank.

To "open" a memory bank refers to the process of retrieving data from the memory cells to the sense amplifiers. Once the data has been retrieved from the memory cells into the sense amplifiers, the memory bank is "opened." To "close" a memory bank, data in the sense amplifiers is rewritten to the memory cells and the sense amplifiers are deactivated.

Each memory bank 12–18 includes row decoder and column control circuits for decoding the row addresses to access the data stored in memory subarrays 22. Additionally, column decoders 21 are located between each memory bank 12–18 and peripheral circuits 23. The row decoder activates a particular word line based on the received address. The column decoder selects one or more sense amplifiers from which data is retrieved based on the received address.

As illustrated in FIG. 1, each memory bank 12–18 is independent of the other memory banks; i.e., each memory bank is capable of being operated and accessed separately from the other memory banks. The arrays of sense amplifiers 20, row decoders, and column decoder circuits are associated with a specific memory bank. Because memory banks 12–18 are independent of one another, all four memory banks 12–18 can be accessed simultaneously.

Die 10 also includes a channel interface and input/output (I/O) pads 24, which are coupled to the pins or leads of the memory device. Additionally, peripheral circuits 23 are located on die 10. Peripheral circuits 23 include the circuits necessary to operate the memory device, such as voltage regulators and mechanisms for routing signals such as addresses, memory bank control signals, row sense signals, and memory bank open and close signals. Die 10 shown in FIG. 1 is provided for purposes of explanation, and is not necessarily drawn to scale.

As the number of memory banks in a memory device increases, the amount of support circuitry required increases and the die size (or die area) increases. In existing memory devices, each memory bank requires separate row decoders and other control circuits to support the memory bank. Additionally, each memory bank requires separate sense amplifiers to provide independent memory bank operation. Existing memory devices that have a small number of memory banks (e.g., 2 or 4 banks) do not require a significant increase in the number of sense amplifiers. However, as the number of memory banks increases (e.g., 8 or 16 banks), the additional area required by sense amplifiers becomes significant and increases die cost.

SUMMARY AND OBJECTS OF THE INVENTION

An objective of the present invention is to provide a mechanism for minimizing the die area required for a memory device having multiple memory banks.

Another objective of the invention is to provide a mechanism for sharing sense amplifiers between multiple memory banks.

An embodiment of the invention provides a memory device including a first memory bank and a second memory bank, in which each memory bank has at least one subarray of memory cells. The memory device also includes multiple sense amplifiers, each coupled to at least one subarray of memory cells. At least one sense amplifier is coupled to a memory subarray in the first memory bank and a memory subarray in the second memory bank.

Other objects, features, and advantages of the present invention will be apparent from the accompanying drawings and from the detailed description that follows below.

BRIEF DESCRIPTION OF THE DRAWINGS

The present invention is illustrated by way of example in the figures of the accompanying drawings, in which like references indicate similar elements, and in which.

DETAILED DESCRIPTION

Embodiments of the present invention provide a memory device that has multiple memory banks that share one or more sense amplifiers. As discussed above, a memory bank typically includes multiple memory subarrays and multiple sense amplifiers. Additionally, a memory bank includes row decoders and column decoders to decode row and column addresses to access the data stored within the memory subarrays.

Although existing memory devices share sense amplifiers between memory subarrays within a particular memory bank, embodiments of the present invention share sense amplifiers between different memory banks. This sharing of sense amplifiers between different memory banks is referred to as a dependent bank organization. By sharing sense amplifiers between memory banks, less die area is required than with conventional systems that do not share sense amplifiers between memory banks. This smaller die area reduces the cost of the memory device. The use of shared sense amplifiers between memory banks also allows more memory banks to be provided in the same die area, thereby increasing memory performance. However, when sharing sense amplifiers between memory banks, it becomes necessary to restrict access to a particular memory bank in certain situations.

An embodiment of the present invention is related to a mechanism that allows multiple memory banks in a memory device to share one or more sense amplifiers. This sharing of sense amplifiers between memory banks reduces the die area of the memory device by reducing the number of sense amplifiers in the device compared to a device with fully independent banks.

Figure 1:
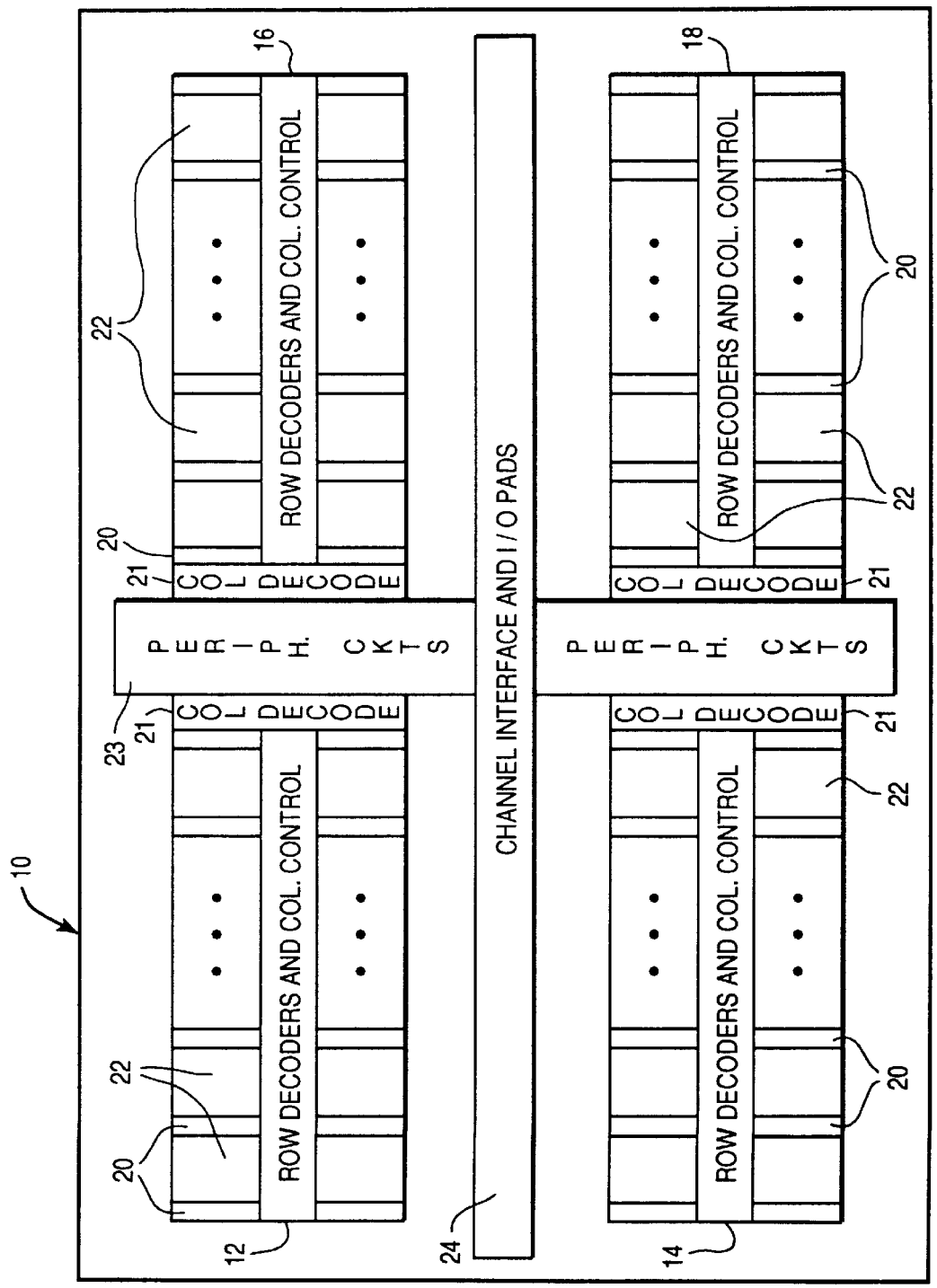
FIG. 1 illustrates a die for a memory device having a conventional core architecture.
Figure 2:
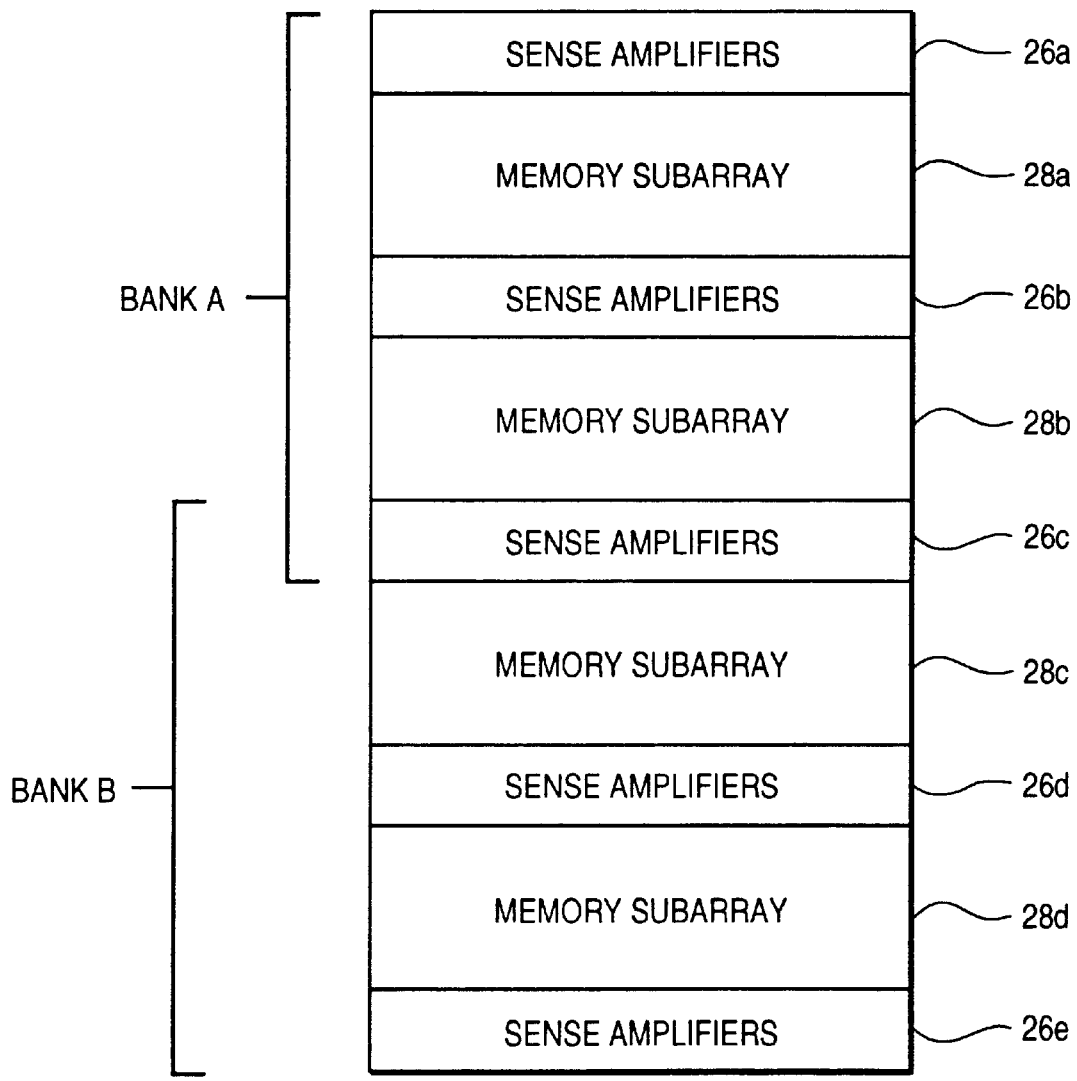
FIG. 2 illustrates an embodiment of a pair of memory subarrays having sense amplifiers on opposite sides of each subarray.

FIG. 2 illustrates an embodiment of a pair of memory subarrays having sense amplifiers on opposite sides of each subarray. Multiple memory subarrays 28a, 28b, 28c, and 28d are arranged with multiple sense amplifier arrays 26a, 26b, 26c, 26d, and 26e, as shown. Memory subarrays 28a and 28b are associated with memory bank A and memory subarrays 28c and 28d are associated with memory bank B. In this arrangement, memory subarray 28b uses sense amplifiers 26b and 26c to access data in the memory subarray. Similarly, memory subarray 28c uses sense amplifiers 26c and 26d to access data in the memory subarray. In this example, sense amplifiers 26c are shared by both memory subarray 28b and memory subarray 28c. Thus, sense amplifiers 26c are shared by memory bank A and memory bank B. Although a shared sense amplifier (e.g., sense amplifier 26c) is in use by memory bank B, memory bank A can still be accessed (e.g., memory subarray 28a), but not to the subarray with the shared sense amplifier.

Shared sense amplifiers 26c are substantially similar to sense amplifiers 26a, 26b, 26d, and 26e, and occupy substantially the same die area. In one embodiment of the invention, sense amplifiers 26c are identical to sense amplifiers 26a, 26b, 26d, and 26e. Due to the fact that sense amplifiers 26c are shared between memory bank A and memory bank B, die area is reduced from that which would be required if each memory bank had an independent array of sense amplifiers (e.g., two sense amplifier arrays located between memory bank A and memory bank B). This reduction in die area reduces the overall size of the die for a particular memory capacity.

Figure 3:
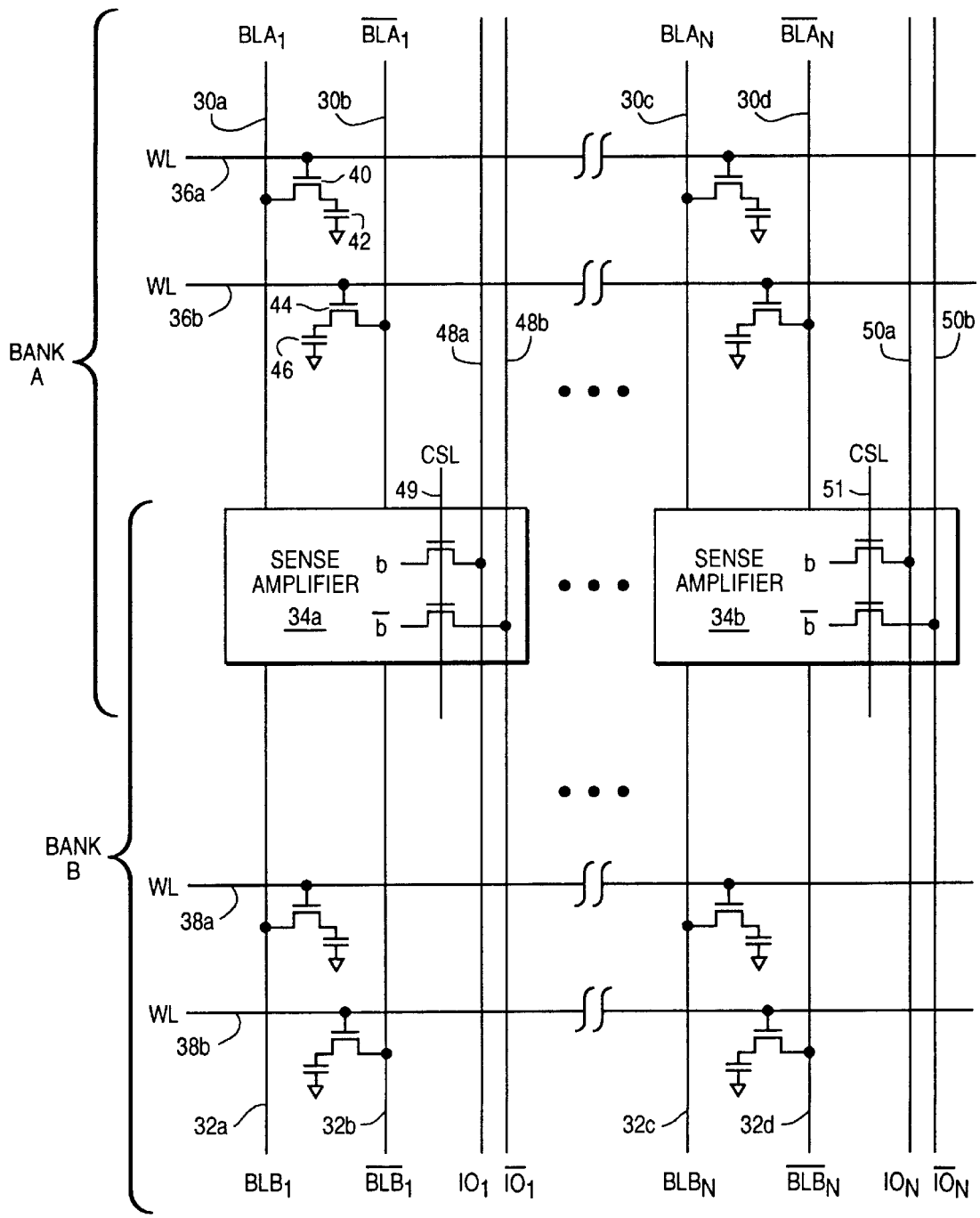
FIG. 3 is a detailed illustration of a portion of a memory device having adjacent memory banks.

FIG. 3 is a detailed illustration of a portion of a memory device having adjacent memory banks (identified as Bank A and Bank B). A pair of bit lines 30a and 30b are coupled to a sense amplifier 34a. Another pair of bit lines 30c and 30d are coupled to a sense amplifier 34b. Bit lines 30a, 30b, 30c, and 30d are associated with a memory subarray in a first memory bank (e.g., memory bank A in FIG. 2). Bit lines 32a and 32b are coupled to sense amplifier 34a, and bit lines 32c and 32d are coupled to sense amplifier 34b. Bit lines 32a, 32b, 32c, and 32d are associated with a memory subarray in a second memory bank (e.g., memory bank B in FIG. 2). Although bit lines 30a–30d and 32a–32d are coupled to and share the same sense amplifiers 34a and 34b, only one set of bit lines can be accessed at a particular time.

Word lines 36a and 36b are positioned perpendicular to bit lines 30a–30d. Similarly, word lines 38a and 38b are positioned perpendicular to bit lines 32a–32d. Each memory subarray is divided into multiple cells, in which each cell stores a single bit of information. For example, capacitors 42 and 46 each store a single bit of information. Each capacitor in a memory subarray is coupled to a gate, such as a transistor, which allows data to be stored in or retrieved from the capacitor.

For example, when word line 36a is activated, a transistor 40 is also activated such that a charge stored in capacitor 42 is transferred to bit line 30a. Sense amplifier 34a identifies the charges on the two bit lines 30a and 30b. Based on the charge values on each bit line 30a and 30b, sense amplifier 34a determines the value stored in the cell (i.e., the charge stored in capacitor 42). A similar operation may be used to activate a transistor 44 to store data in or retrieve data from capacitor 46. Thus, the data stored in any particular cell is determined by activating the word line associated with the desired data, and identifying the charges on a pair of bit lines associated with the desired data.

After the data has been identified by the sense amplifier, the data is transmitted from the sense amplifier across I/O wires 48a and 48b. I/O wires 48a and 48b may be coupled to multiple arrays of sense amplifiers and are capable of transmitting data to and from any of the sense amplifiers coupled to the I/O wires. A column select line (CSL) is activated to cause a particular sense amplifier to read data from or write data to the I/O wires. For example, CSL 49 activates sense amplifier 34a to read from or write to I/O wires 48a and 48b. Similarly, CSL 51 activates sense amplifier 34b to read from or write to I/O wires 50a and 50b.

It will be appreciated by those of ordinary skill in the art that FIG. 3 illustrates a small portion of a memory device. An actual device may contain hundreds or thousands of bit lines and word lines, and numerous associated capacitors, transistors, and sense amplifiers. Additionally, the direction of the I/O lines and CSL lines in FIG. 3 with respect to the direction of the bit lines and word lines is illustrative. It will be appreciated that other arrangements of the I/O lines, CSL lines, bit lines, and word lines are possible within the scope of the invention. As discussed above, memory core organizations can be classified into two broad categories: conventional organizations in which I/O wires are perpendicular to the bit lines, and hierarchical organizations in which the I/O wires are parallel to the bit lines. Particularly in hierarchical organizations, the arrangement of the memory subarrays and sense amplifiers allows for memory bank organizations that can share sense amplifiers between memory banks. This can lead to significant die area savings, which is particularly important as the requirement for the number of memory banks per memory device increases in higher performance systems.

Figure 4:
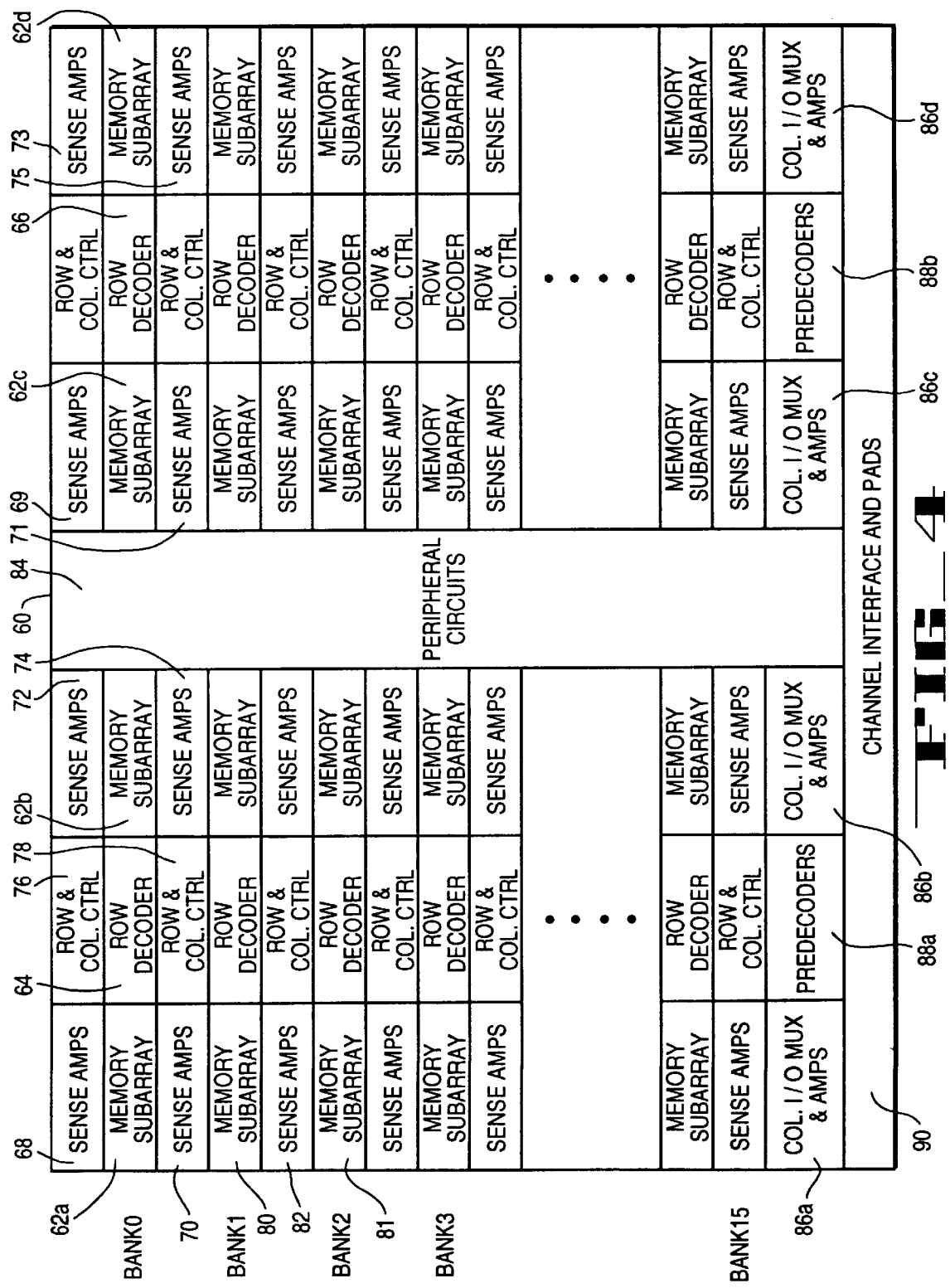
FIG. 4 illustrates an embodiment of a die for a memory device using shared sense amplifiers between multiple memory banks.

FIG. 4 illustrates an embodiment of a die for a memory device using shared sense amplifiers positioned between adjacent memory banks. Die 60 includes 16 memory banks, labeled bank 0–bank 15. Each memory bank includes four memory subarrays arranged horizontally, as shown in FIG. 4. For example, memory bank 0 includes memory subarrays 62*a*, 62*b*, 62*c*, and 62*d*. Each memory subarray has an array of sense amplifiers located on opposite sides of the subarray. For example, memory subarray 62*a* has sense amplifiers 68 and 70 located on opposite sides of the subarray. Similarly, memory subarray 62*b* has sense amplifiers 72 and 74 located on opposite sides.

In this example, row decoders are positioned between the first and second memory subarrays as well as the third and fourth memory subarrays. For example, in memory bank 0, row decoder 64 is positioned between memory subarrays 62*a* and 62*b*. Similarly, row decoder 66 is positioned between memory subarrays 62*c* and 62*d*. The row decoders are used to select the data stored in the adjacent memory subarrays.

In the embodiment of FIG. 4, row and column control circuits are located between the first and second sense amplifiers and the third and fourth sense amplifiers. For example, row and column control circuit 76 is located between sense amplifier arrays 68 and 72.

FIG. 4 also illustrates column I/O multiplexers and amplifiers located adjacent to memory bank 15. For example, column I/O multiplexers and amplifiers 86*a*, 86*b*, 86*c*, and 86*d* are used to control access to the various memory subarrays in die 60. Predecoders 88*a* and 88*b* are used in conjunction with the row decoders and other control circuits to access the information stored within the memory subarrays. Peripheral circuits 84 include the various components and circuits necessary for the die to operate properly. Channel interface and pads 90 are used to couple the information contained in the various memory subarrays to the external pins or connections of the memory device that contains die 60.

As shown in FIG. 4, the memory subarrays of adjacent memory banks share sense amplifiers located between the memory subarrays. For example, sense amplifiers 70 are located between memory subarray 62*a* (bank 0) and memory subarray 80 (bank 1). Thus, rather than providing two separate sense amplifiers between memory bank 0 and memory bank 1 (one sense amplifier for memory subarray 62*a* and another sense amplifier for memory subarray 80), a single array of sense amplifiers 70 is shared by the two memory subarrays 62*a* and 80. Similarly, sense amplifiers 82 located between memory subarray 80 (bank 1) and memory subarray 81 (bank 2) are shared by the two memory subarrays 80 and 81. This sharing of sense amplifiers by adjacent memory banks is repeated throughout die 60.

Due to the fact that the sense amplifiers shown in FIG. 4 are shared between adjacent memory banks, only one of the adjacent memory banks may be accessed at a particular time. For example, if memory bank 0 is being accessed, then the sense amplifiers associated with memory subarrays 62*a*–62*d* are being used (i.e., sense amplifiers 68–75). In this situation, memory bank 1 shares sense amplifiers 70, 71, 74 and 75 being used by memory bank 0. Therefore, memory bank 1 cannot be accessed when memory bank 0 is being accessed. Similarly, if memory bank 1 is being accessed, then neither memory bank 0 nor memory bank 2 can be accessed due to the shared sense amplifier arrays on both sides of memory bank 1. However, memory banks 3–15 are not affected by the accessing of memory bank 1. Thus, when a particular memory bank is accessed, adjacent memory banks that share sense amplifier arrays cannot be accessed, but those memory banks that do not share sense amplifiers may be accessed.

The memory core configuration illustrated in FIG. 4 represents one configuration capable of implementing the teachings of the present invention. In alternate embodiments, various other core configurations may be used to practice the present invention. Alternative configurations may include any number of memory banks of various sizes and containing any number of memory subarrays.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than restrictive sense.

What is claimed is:

1. A memory device comprising:
    a first memory bank including at least one subarray of memory cells, the first memory bank having a first row decoder and a first column decoder;
    a second memory bank including at least one subarray of memory cells, the second memory bank having a second row decoder and a second column decoder; and
    a first plurality of sense amplifiers including at least one sense amplifier coupled to one memory subarray in the first memory bank and one memory subarray in the second memory bank wherein the first and the second memory banks are accessible independently of each other.

2. The memory device of claim 1, further comprising:
    a plurality of I/O lines coupled to the plurality of sense amplifiers; and
    a select signal coupled to the plurality of sense amplifiers, wherein the select signal is configured to transfer data between at least one of the plurality of sense amplifiers and at least one of the plurality of I/O lines.

3. The memory device of claim 1 wherein the first memory bank and the second memory bank are oriented such that a first side of the first memory bank is facing a first side of the second memory bank.

4. The memory device of claim 1 wherein the memory device includes a plurality of memory banks and a plurality of sense amplifier arrays located between adjacent memory banks, wherein each sense amplifier array includes a second plurality of sense amplifiers.

5. The memory device of claim 4 wherein each subarray of memory cell includes a plurality of bit lines coupled to the memory cells and a plurality of I/O lines coupled to the sense amplifiers.

6. The memory device of claim 5 wherein the I/O lines are parallel to the bit lines.

7. The memory device of claim 5 wherein the I/O lines are perpendicular to the bit lines.

8. The memory device of claim 1 wherein the memory device is a dynamic memory device.

9. The memory device of claim 1 wherein the memory device is a static memory device.

10. A memory device comprising:

a first memory bank including at least one subarray of memory cells, the first memory bank having a first row decoder and a first column decoder;

a first sense amplifier coupled to a memory subarray in the first memory bank and a memory subarray in a second memory bank;

a second sense amplifier coupled to a second memory subarray in the first memory bank, and a memory subarray in a third memory bank;

wherein the first memory bank is not simultaneously accessed with the second memory bank or the third memory bank.

11. The memory device of claim 10 wherein the first memory bank and the second memory bank are oriented such that a first side of the first memory bank is facing a first side of the second memory bank.

12. The memory device of claim 10 wherein the memory device includes a plurality of memory banks and a plurality of sense amplifier arrays located between adjacent memory banks, wherein each sense amplifier array includes a plurality of sense amplifiers.

13. The memory device of claim 10 wherein the memory device is a dynamic memory device.

14. The memory device of claim 10 wherein the memory device is a static memory device.

15. The memory device of claim 10 wherein each subarray of memory cell includes a plurality of bit lines coupled to the memory cells and the plurality of I/O lines coupled to the sense amplifiers.

16. The memory device of claim 15 wherein the I/O lines are parallel to the bit lines.

17. The memory device of claim 15 wherein the I/O lines are perpendicular to the bit lines.

18. A memory device comprising:

a first memory bank including at least one subarray of memory cells, the first memory bank having a first x and y decoder;

a second memory bank including at least one subarray of memory cells, the second memory bank having a second x and y decoder;

a third memory bank including at least one subarray of memory cells, the third memory bank having a third x and y decoder;

the first memory bank and the second memory bank are accessible independently of each other;

a first plurality of sense amplifiers, wherein each sense amplifier is coupled to at least one subarray of memory cells, and wherein at least one sense amplifier is coupled to one memory subarray in the first memory bank and one memory subarray in the second memory bank;

a second plurality of sense amplifiers, wherein each sense amplifier is coupled to at least one subarray of memory cells, and wherein at least one sense amplifier is coupled to one memory subarray in the second memory bank and one memory subarray in the third memory bank.

19. The memory device of claim 18, wherein any two memory banks that do not share a sense amplifier are simultaneously accessible.

* * * * *